United States Patent
Hennig et al.

(10) Patent No.: US 7,292,034 B2
(45) Date of Patent: Nov. 6, 2007

(54) METHOD FOR DYNAMIC DETECTION AND CHANGE IN THE MAGNETIC FIELD DISTRIBUTION IN MAGNETIC RESONANCE (NMR) MEASUREMENTS

(75) Inventors: Juergen Hennig, Freiburg (DE); Oliver Speck, Freiburg (DE); Maxim Zaitse, Freiburg (DE)

(73) Assignee: Universitätsklinikum Freiburg, Freiburg (DE)

( * ) Notice: Subject to any disclaimer, the term of this patent is extended or adjusted under 35 U.S.C. 154(b) by 0 days.

(21) Appl. No.: 11/199,660

(22) Filed: Aug. 9, 2005

(65) Prior Publication Data

US 2006/0033494 A1 Feb. 16, 2006

(30) Foreign Application Priority Data

Aug. 11, 2004 (DE) .................. 10 2004 038 917

(51) Int. Cl.
*G01V 3/00* (2006.01)
(52) U.S. Cl. ........................ 324/309; 324/307
(58) Field of Classification Search ........... 324/309, 324/307
See application file for complete search history.

(56) References Cited

U.S. PATENT DOCUMENTS

| | | | |
|---|---|---|---|
| 5,345,178 A | 9/1994 | Manabe et al. | |
| 6,064,208 A * | 5/2000 | Steckner | 324/320 |
| 6,445,182 B1 * | 9/2002 | Dean et al. | 324/309 |
| 6,472,872 B1 * | 10/2002 | Jack et al. | 324/309 |
| 6,507,190 B1 * | 1/2003 | Hinks et al. | 324/307 |
| 2001/0048306 A1 | 12/2001 | Mueller et al. | |

FOREIGN PATENT DOCUMENTS

DE     195 11 791 C1    8/1996

(Continued)

OTHER PUBLICATIONS

Rolf Gruetter and Ivan Tkac, "Field Mapping Without Reference Scan Using Asymmetric Echo-Planar Techniques", Magnetic Resonance in Medicine, 43: 319-323 (2000), Wiley-Liss, Inc., USA.

(Continued)

*Primary Examiner*—Louis M. Arana
(74) *Attorney, Agent, or Firm*—Walter A. Hackler

(57) ABSTRACT

A magnetic resonance (NMR) method for fast, dynamic, spatially resolved measurement of the temporal changes in NMR signals by means of repeated data acquisition in individual measurements (Acq) with measuring sequences which are sensitive to a parameter to be observed, in an NMR apparatus with shim coils for correcting the magnetic field is characterized in that during data acquisition of each individual measurement (Acq) in acquisition steps ($S_1 \ldots S_n$) with a time lag, the magnetic field distribution in the NMR apparatus is measured, technically or physiologically based changes in the magnetic field distribution are determined therefrom in a calculation step ($S_{calc}$) as well as a change in the currents in the magnetic field required for compensation thereof, and the dynamic changes in the magnetic field distribution are compensated for by means of the correspondingly changed shim currents. The inventive method permits dynamic detection of the changes in the magnetic field distribution through the above-mentioned factors during the measurement and compensation thereof through corresponding re-calculation of $\Delta y(x,y,z)$ or $\Delta B_0(x,y,z)$ and adjustment of the shim currents to render the magnetic field distribution for subsequent measurements again preferably identical to the initial magnetic field distribution.

5 Claims, 3 Drawing Sheets

FOREIGN PATENT DOCUMENTS

DE    199 59 720 A1    6/2001
EP    0 949 512 A2    10/1999

OTHER PUBLICATIONS

Huairen Zeng and R. Todd Constable, "Image Distortion Correction in EPI: Comparison of Field Mapping With Point Spread Function Mapping", Magnetic Resonance in Medicine, 48:137-146 (2002), Wiley-Liss, Inc., USA.

M. Terpstra, P.M. Andersen, and R. Gruetter, "Localized Eddy Current Compensation Using Quantitative Field Mapping", Journal of Magnetic Resonance, 131, 139-143 (1998), Academic Press.

Friston, K.J., Ashburner, J., et al. (1995). "Spatial realignment and normalization of images." *Hum Brain Mapp* 2, 165-89.

Gruetter, R. (1993). "Automatic, localized in vivo adjustment of all first- and second- order shim coils." *Magn Reson Med* 29(6): 804-11.

Jezzard, P. and R. S. Balaban (1995). "Correction for geometric distortion in echo planar images from BO field variations." *Magn Reson Med* 34(1): 65-73.

Mansfield, P. (1977). "Multi-planar image formation using NMR spin-echoes." *J Phys C* 10: L5-L58.

Robson, M. D., J. C. Gore, et al. (1997). "Measurement of the point spread function in MRI using constant time imaging." *Magn Reson Med* 38(5): 733-40.

Thesen, S., O. Heid, et al. (2000). "Prospective acquisition correction for head motion with image-based tracking for real-time fMRI." *Magn Reson Med* 44(3): 457-65.

* cited by examiner ed data acquisition in individual measurements with
METHOD FOR DYNAMIC DETECTION AND CHANGE IN THE MAGNETIC FIELD DISTRIBUTION IN MAGNETIC RESONANCE (NMR) MEASUREMENTS The invention concerns a magnetic resonance (NMR) method for rapid, dynamic, spatially resolved measurement of the temporal changes in NMR signals by means of repeated data acquisition in individual measurements with measuring sequences which are sensitive to a parameter to be observed, in an NMR apparatus with shim coils which correct the magnetic field.

The methods generally used today for NMR imaging utilize spatially varying magnetic fields for spatial encoding of the observed spins. These magnetic fields which are used for spatial encoding overlap the basic field of the outer magnet due to temporally varying magnetic field gradients. A two- or three-dimensional data set is generated through acquisition of the temporally varying nuclear resonance signal, and is converted into corresponding spatial images by means of corresponding multi-dimensional Fourier transformation. A spatially true image is obtained only if the basic field in the observed volume is constant and homogeneous and if the gradients used produce an exactly linear change in the magnetic field in the gradient direction or if the deviations from this ideal behavior are known and can be compensated for.

The homogeneity of the magnetic field distribution, in particular relative to the basic field, is impaired by technical imperfections and also by the so-called susceptibility effects caused by the different magnetic properties of the investigated object. This produces image distortions which may be in a range of several millimeters to centimeters depending on the recording sequence used. Moreover, susceptibility effects can show in the form of signal modulations or signal cancellations in certain areas of the investigated object. A method which is particularly susceptible thereto and is often used for rapid spatially encoded measurement of temporally varying signal intensities is echo planar imaging (EPI). This method is characterized in that a large amount of raw data (k space points or lines) is recorded through a combination of gradient switching and data recording after an excitation pulse [4].

The EPI method shows local geometric distortions due to magnetic field inhomogeneities $\Delta B_0(x,y,z)$ which are produced by the magnet itself and mainly by the object to be investigated. These erroneous images $\Delta y(x,y,z)$ occur mainly in the phase encoding direction and depend on the read-out bandwidth BW, the matrix size kx*ky, and on the acquisition field FOV (field of view): $\Delta y(x,y,z)=\Delta B_0(x,y,z)*\gamma*kx/BW*FOV_y/ky$.

Magnetic field inhomogeneities may vary with time. These variations are generated on the one hand through instabilities in the device and on the other hand through motion of the object within and outside of the acquisition field and therefore through displacement of substances having magnetic properties which are different from those of air and influence the field.

The magnetic field distortions caused by the mentioned effects are compensated for by so-called shim coils which generate magnetic fields of a certain geometry to be superposed on the main field. The shim coils are normally adjusted before measurement through determination of the magnetic field distribution and calculating and applying shim currents for optimum compensation of field inhomogeneities.

The imperfections of the magnetic fields can be experimentally determined through corresponding reference measurements e.g. using "field mapping" [3] or "point spread function mapping" [5], [7]. The result of these reference measurements is $\Delta y(x,y,z)$ or $\Delta B_0(x,y,z)$, which permits compensation of the distortions.

Minor movements which can occur e.g. in functional MRT (magnetic resonance tomography) measurements between acquisition of individual data sets can thereby be corrected either prospectively [6] or retrospectively [1]. The magnetic field changes induced by these movements can, in principle, not be calculated from the initial magnetic field distribution and the motion of the object. Moreover, factors outside of the detected measuring volume which influence the magnetic field distribution in the measuring volume are not detected.

All methods used up to now are based on the performance of corresponding adjustment routines which have a duration of between 10-100s depending on the method used. Such adjustments are generally performed before the measurement starts, thereby assuming that the corresponding inhomogeneities do not change during the measurement.

This assumption is only approximately justified. In particular, in experiments for measuring the temporal variation of the signal, data is acquired through multiple repetition of a sequence which is particularly sensitive to the parameters to be observed over a time period which may last several minutes. Typical examples of such sequential measurements are measurements of brain activation using BOLD methods such as EPI, spiral imaging, and also perfusion measurements through observation of the signal change caused by a contrast medium bolus.

Such measurements may involve temporal changes in the magnetic field distribution during repeated measurements due to a series of mechanisms, which can cause considerable measuring errors of the parameter to be determined. The following effects support this: the extended application of very fast and strong magnetic field gradients causes changes in the temperature distribution in the gradient tube and in the shim coils. These produce technically based changes in the magnetic field distributions caused by the currents in these coils. Moreover, the mentioned susceptibility effects, which result from interaction between the tissue and the external field, change due to motion of the patient, which causes distortions as well as changes in the signal intensity. These effects cannot be corrected by simple geometrical corrections. Changes caused by the patient can also occur due to motions in regions outside of the actual measuring window. It has turned out that in high field systems, even motion of the chest due to breathing causes relevant field changes in the brain.

SUMMARY OF THE INVENTION

It is the object of the present invention to propose a method for dynamically detecting the changes in the magnetic field distribution caused by the above-mentioned factors during the measurement and compensation thereof through corresponding re-calculation of $\Delta y(x,y,z)$ or $\Delta B_0(x,y,z)$ and adjustment of the shim currents to render the magnetic field distribution for subsequent measurements preferably identical to the initial magnetic field distribution.

This object is achieved in accordance with the invention in that during data acquisition of each individual measurement, the magnetic field distribution in the NMR apparatus is measured in acquisition steps with a time lag, that technically or physiologically caused changes in the magnetic field distribution and changes in the currents in the shim coils required for compensation thereof, which correct the magnetic field, are determined in a calculation step, and that the dynamic changes in the magnetic field distribution are compensated for by means of the correspondingly changed shim currents.

The magnetic field distribution is thereby preferably determined in periodic intervals. The residual magnetic field changes can be taken into consideration for the reconstruction of the image data by updating and applying the correction fields $\Delta y(x,y,z)$ or $\Delta B_0(x,y,z)$. The deviations from the initial value are minimized by the inventive method, thereby minimizing the corrections required. The methods which are usually used to measure the magnetic field distribution are not suitable for such dynamic (and ideally continuous) correction since they are too time-consuming with respect to the required data acquisition steps and also with respect to postprocessing algorithms.

In a first method variant, the magnetic field distribution is determined through acquisition steps using so-called "navigators", wherein each navigator is used in the form of an acquisition of a signal which is one-dimensional in the k-space, such that, to determine the three-dimensional magnetic field distribution, at least n=3 navigators in the three spatial directions are required. According to the method [2] based on FASTMAP, the magnetic field distributions are determined through sequential measurement of one-dimensional profiles along a Cartesian main axis of the field of investigation, and the magnetic field deviations from the ideal homogeneity are calculated therefrom on the basis of the spatial distribution of the magnetic fields generated by the shim coils.

In a variant of this method, only m navigators are acquired in each individual measurement, wherein 1<m≦n such that determination of the spatial magnetic field distribution is completed not until n/m individual measurements are finished, wherein after each individual measurement a new magnetic field distribution is determined from the respectively previous n/m individual measurements.

In a further variant of the inventive method, the magnetic field is distributed through additionally introduced measurements using two- or three-dimensional sequences having a spatially low resolution- and being sensitive to inhomogeneities, such as e.g. the echo planar imaging method, wherein at least two sequences are carried out at different echo times to determine the local field-caused resonance frequencies.

In a further development of this method, only part of the data required for complete measurement of the magnetic field distribution is acquired in each individual measurement, such that determination of the spatial magnetic field distribution is completed not until several individual measurements are finished, wherein, however, after each individual measurement, a new magnetic field distribution is determined from the respectively previous individual measurements. These measurements can be performed with a small excitation tilt angle α to prevent or minimize influence on the signal of the current measurement.

In a further variant of the inventive method, the magnetic field distribution is calculated directly from the phase change of the image data caused by periodic change in the echo time without additional measuring steps. This is particularly advantageous if the change between two subsequent measurements is very small compared to the deviations of the magnetic field distribution from an ideally homogeneous magnetic field which is generally the case.

This eliminates many difficulties which usually occur in the calculation of magnetic field distributions from data obtained through nuclear magnetic tomography. The magnetic field strength is generally determined from the phase development of the NMR signal $\Phi$. If it is measured at different times, the Larmor frequency and therefore also the magnetic field strength can be calculated from the phase difference in accordance with $B_0(x,y,z)=[\Phi(x,y,z,t2)-\Phi(x,y,z,t1)]/(t2-t1)/\gamma$.

For small changes in $B_0(x,y,z)$, a phase difference may be unambiguously associated with a magnetic field change, thereby permitting sequential calculation of the change in the magnetic field distribution from the temporal change in the phase of the image data ("dynamic reference"). The magnetic field can thereby be unambiguously and continuously detected using the previous knowledge from the reference measurement.

Since in most cases, the signal phase cannot be determined unambiguously but only modulo 2*Pi, complex algorithms must generally be used for deconvolution of the data which often fails in particular for discontinuous objects. A variant of the inventive method is therefore particularly preferred, wherein the acquisition steps for a reference measurement for the magnetic field distribution are performed at the start of the measurement and only the change in the magnetic field distribution is measured in periodic repetitions during the measurement by means of further acquisition steps ("static reference"). The current magnetic field distribution is calculated from the initial magnetic field distribution which is determined in a reference measurement in s steps, and from its changes.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

BRIEF DESCRIPTION OF THE DRAWINGS

The advantages and features of the present invention will be better understood by the following description when considered in conjunction with the accompanying drawings, in which.

DETAILED DESCRIPTION

Figure 1A:
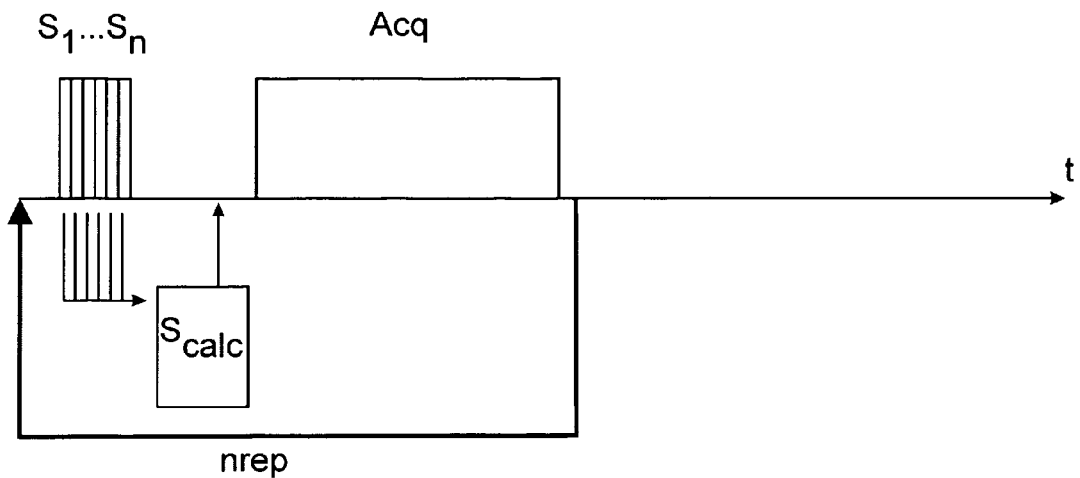
FIG. 1A shows a diagram of the inventive method for dynamic adjustment of the magnetic field distribution.

FIG. 1A shows a diagram of the method for dynamic adjustment of the magnetic field distribution with nrep times repeated data acquisition, wherein before each individual measurement Acq the magnetic field distribution is measured in n acquisition steps $S_1 \ldots S_n$ of a shim sequence and the shim currents required for compensation of field inhomogeneities are calculated and applied in the subsequent calculation step $S_{calc}$.

The acquisition steps $S_1 \ldots S_n$ of the additionally inserted periodic shim sequence may be based on navigator measurements according to the FASTMAP method. Towards this end, at least one measurement (for the previous application for a one-time static field measurement typically also several measurements) is carried out in each of the three main directions of the magnetic field. The number n of measuring steps is therefore typically $n \geq 3$.

Figure 1B:
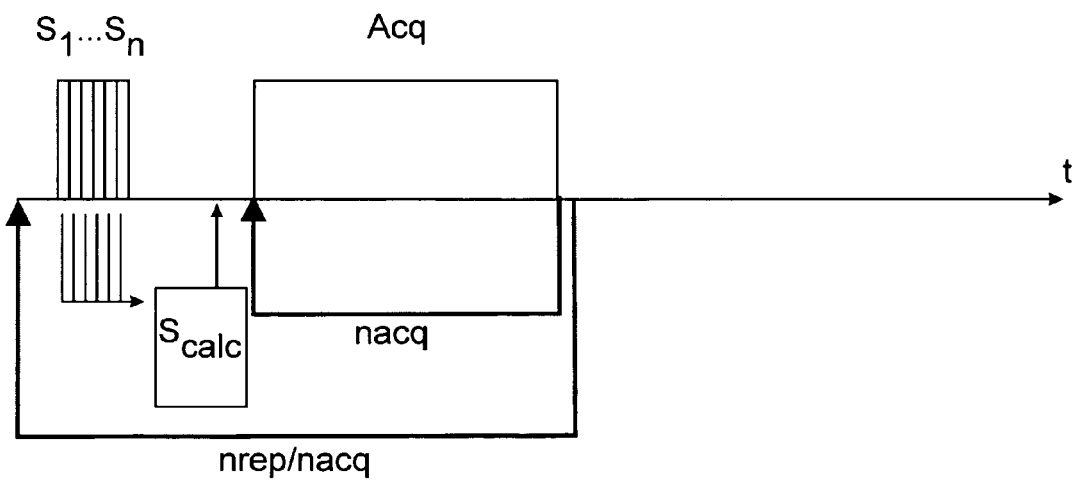
FIG. 1B shows a diagram of a variant of the inventive method according to FIG. 1A, wherein the individual acquisitions of the magnetic field distribution are performed after nacq acquisition steps in each case.

In a modification of this approach, measurement and compensation of the magnetic field distribution is not performed before each individual measurement Acq but the shim sequence is rather used after nacq individual measurements Acq. FIG. 1B shows such a diagram. The entire acquisition of the nrep individual measurements Acq is therefore effected after nrep/nacq repetitions.

Figure 2:
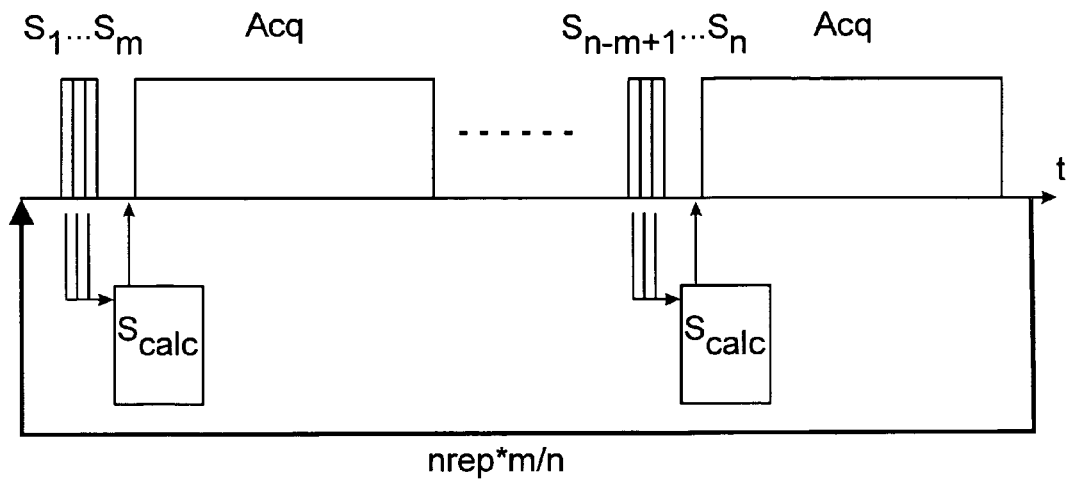
FIG. 2 shows a diagram of a further variant of the inventive method, wherein only part of the data required to measure the magnetic field distribution is acquired before each individual acquisition.

FIG. 2 shows an acquisition diagram of a method variant, wherein only a part m (with 1\m<n) of the n acquisition steps $S_{1 \ldots n}$ of the shim sequence is performed before each individual measurement Acq, therefore requiring only a part m of the data required to measure the magnetic field distribution. For calculation, these m acquisition steps $S_{1 \ldots m}$ are each updated in the calculation step such that the n overall acquisition steps $S_{1 \ldots n}$ required for the calculation are derived from the n/m previous acquisitions. A complete dynamic magnetic field distribution is thereby obtained after n/m individual steps in each case.

Instead of the navigators which are one-dimensional in k-space, a 2 or 3-dimensional measurement of the magnetic field distribution can also be carried out as shim sequence. It may be obtained through acquisition of EPI data of low resolution, wherein the acquisition is performed either sequentially through double recording of EPI sequences EPI(te1), EPI(te2) with different echo times and therefore different phase development of the signal due to the field or also using methods, wherein the desired data is obtained at different echo times with one single excitation of the spin system. Such acquisitions can be performed according to the diagrams shown in FIGS. 1 and 2 either in that the overall acquisition steps $S_{1 \ldots n}$ are performed during each individual measurement Acq (FIG. 1A) or after nacq individual measurements Acq (FIG. 1B) or the overall number of acquisition steps $S_{1 \ldots n}$ is distributed over n/m individual measurements Acq (FIG. 2). These measurements can be carried out with a small excitation tilt angle a to prevent or minimize influence on the signal of the current measurement.

Figure 3:
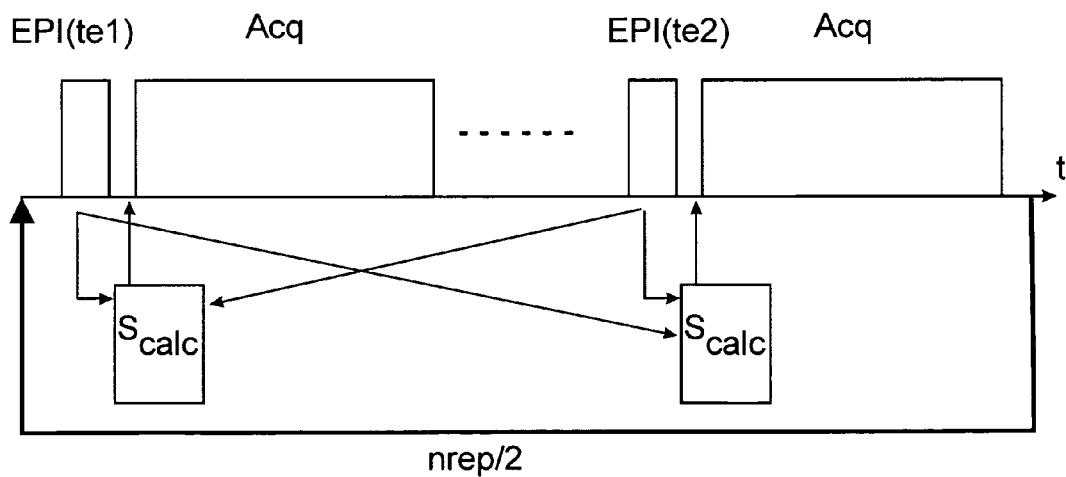
FIG. 3 shows a diagram of a further variant of the inventive method, wherein an acquisition step is performed before each individual acquisition to measure the magnetic field distribution using an EPI sequence.

In a variant of this method, an acquisition step is carried out before each acquisition step Acq to measure the magnetic field distribution using an EPI sequence EPI(te1), EPI(te2). The changes in the magnetic field are detected by periodically varying the echo time of the shim sequence between the individual measurements Acq with a period np which permits determination of a new magnetic field distribution after np repetitions of the individual measurement Acq in accordance with $$B_0(x,y,z) = [\Phi(x,y,z,te2) - \Phi(x,y,z,te1)]/(te2-te1)/\gamma$$

which can be updated through cyclic exchange by the most recent measuring data after each individual measurement Acq. FIG. 3 shows this method variant for np=2. This corresponds to an alternating measurement of two data sets at one read-out time each.

Figure 4:
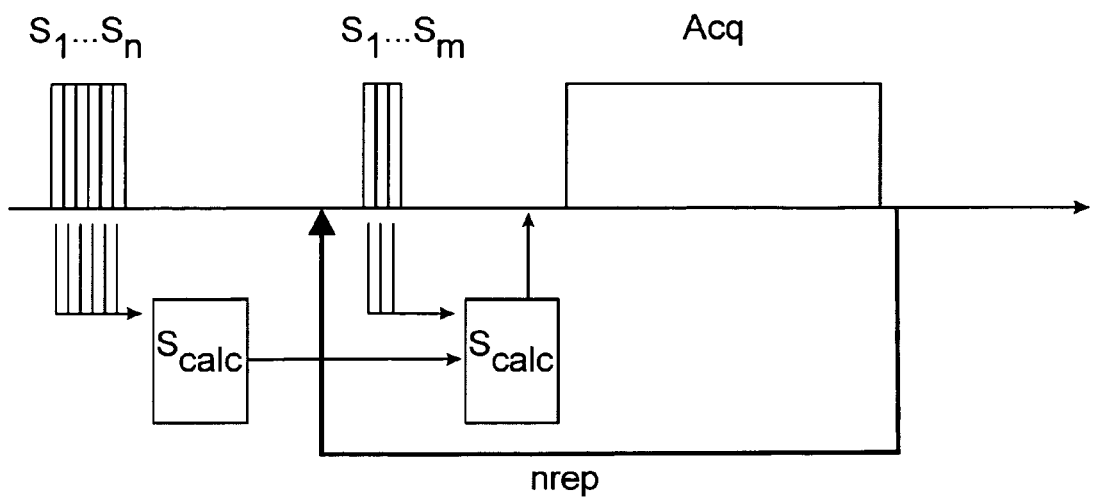
FIG. 4 shows a diagram of a further variant of the inventive method with a static reference.

FIG. 4 shows an acquisition diagram with a static reference. An extensive measurement is carried out before repeated individual measurement Acq using acquisition steps $S_{1 \ldots n}$ of a shim sequence to determine the magnetic field distribution (reference state). For dynamic adjustment of the improvement of the magnetic field distribution, the deviations between the current state and this reference state are determined only with a few acquisition steps $S_{1 \ldots m}$ of the shim sequence before each individual measurement Acq.

Figure 5:
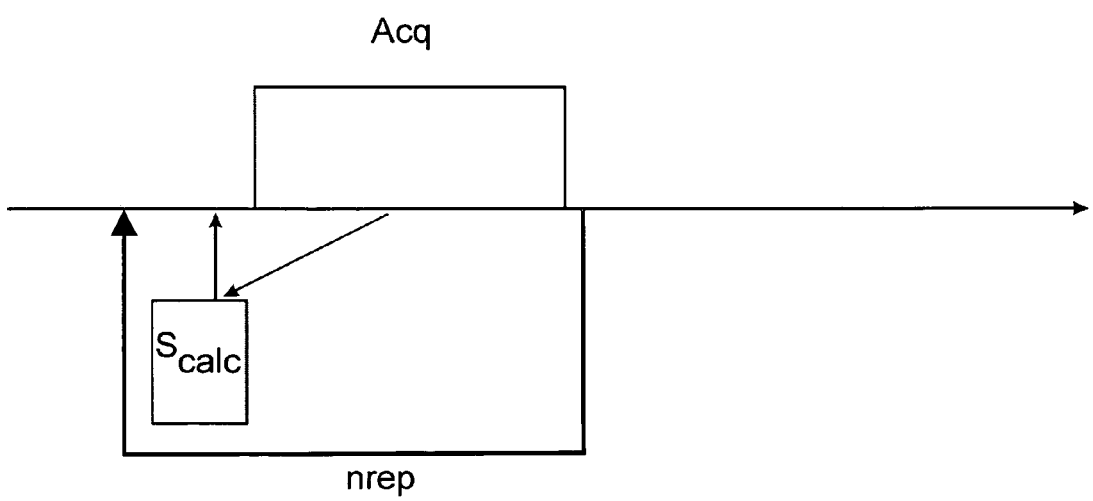
FIG. 5 shows a diagram of a further variant of the inventive method, wherein the magnetic field distribution is determined by the recording sequence itself.

Finally, in a further variant of the inventive method, the change in the magnetic field is determined directly from the actual acquisition data of the individual measurements Acq without additional measuring steps (FIG. 5). This is possible if the individual measurements Acq are themselves sensitive to the magnetic field distribution which is generally the case for methods which are typically used for such measurements (EPI, spiral imaging etc.). The local field changes can be determined through continuous comparison of the signals of consecutive individual measurements Acq corresponding to $$\Delta B_0(x,y,z) = [\Phi(x,y,z,n) - \Phi(x,y,z,n-1)]/TE/\gamma.$$

wherein TE is the echo time of the measurement.

One variant of the method is particularly preferred which determines the magnetic field distribution for all positions in a dynamic reference measurement if the motion of the object under investigation is known and can be reproduced, and correspondingly adjusts the shim currents during repeated motion.

Finally, it should be pointed out that the basic principles of the sequence shown in FIGS. 1.5 can be combined in an arbitrary manner. Instead of the explicitly mentioned measuring methods for the shim sequence based on (in k-space) one-dimensional navigators or EPI methods to measure the magnetic field distribution, also other 2- or 3-dimensional acquisition methods can be carried out according to this diagram.

The inventive magnetic resonance (NMR) method permits dynamic spatially resolved measurements of NMR signals, wherein the magnetic field distribution is determined and its changes are compensated for through adjustment of the currents in the shim coils correcting the magnetic field. This new method reduces the geometric imaging errors and signal intensity fluctuations which change during a dynamic measurement due to motion of the object within or outside of the measuring volume and through device instabilities, thereby increasing the stability of the measurement.

LIST OF REFERENCE NUMERALS $S_{1 \ldots n}$ Acquisition steps
$S_{1 \ldots m}$ Acquisition steps
$S_{calc}$ Calculation Step
Acq Individual measurement
EPI(te1) EPI-Sequence
EPI(te2) EPI-Sequence

LIST OF REFERENCES

[1] Friston, K. J., Ashburner, J., et al. (1995). "Spatial realignment and normalization of images." *Hum Brain Mapp* 2, 165-89.

[2] Gruetter, R. (1993). "Automatic, localized in vivo adjustment of all first- and second-order shim coils." *Magn Reson Med* 29(6): 804-11.

[3] Jezzard, P. and R. S. Balaban (1995). "Correction for geometric distortion in echo planar images from B0 field variations." *Magn Reson Med* 34(1): 65-73.

[4] Mansfield, P. (1977). "Multi-planar image formation using NMR spin-echoes." *J Phys C* 10: L5-L58.

[5] Robson, M. D., J. C. Gore, et al. (1997). "Measurement of the point spread function in MRI using constant time imaging." *Magn Reson Med* 38(5): 733-40.

[6] Thesen, S., O. Heid, et al. (2000). "Prospective acquisition correction for head motion with image-based tracking for real-time fMRI." *Magn Reson Med* 44(3): 457-65.

[7] Zeng, H. and R. T. Constable (2002). "Image distortion correction in EPI: comparison of field mapping with point spread function mapping." *Magn Reson Med* 48(1): 137-46.

The invention claimed is:

1. Magnetic resonance (NMR) method for fast, dynamic, spatially resolved measurement of the temporal changes in NMR signals by means of repeated data acquisition in individual measurements (Acq) with measuring sequences which are sensitive to a parameter to be observed, in an NMR apparatus with shim coils which correct the magnetic field, characterized in that during data acquisition of each individual measurement (Acq) in repeated acquisition steps ($S_1 \ldots S_n$) with a time lag, the two- or three-dimensional spatial magnetic field distribution in the NMR apparatus is measured, and that associated technically or physiologically based changes in the magnetic field distribution are determined in a calculation step ($S_{calc}$), and compensated by a linear as well as a non-linear dynamic change in the currents in said shim coils, wherein the magnetic field distribution is performed through additionally introduced measurements using two- or three-dimensional sequences (EPI(te1), EPI(te2) having a low spatial resolution and being sensitive to inhomogeneities, wherein at least two sequences EPI(te1), EPI(te2) are carried out at different echo times to determine the local resonance frequencies caused by the field.

2. Method according to claim 1, characterized in that during each individual measurement (Acq) only part of the data required for complete measurement of the magnetic field distribution is acquired such that determination of the spatial magnetic field distribution is completed not until several individual measurements (Acq) are finished wherein after each individual measurement (Acq) a new magnetic field distribution is determined from the respectively previous individual measurements (Acq).

3. Magnetic resonance (NMR) method for fast, dynamic, spatially resolved measurement of the temporal changes in NMR signals by means of repeated data acquisition in individual measurements (Acq) with echo planar imaging sequences which are sensitive to a parameter to be observed, in an NMR apparatus with shim coils which correct the magnetic field, characterized in that during data acquisition of each individual measurement (Acq) in repeated acquisition steps ($S_1 \ldots S_n$) with a time lag, the two- or three-dimensional spatial magnetic field distribution in the NMR apparatus is measured, and that associated technically or physiologically based changes in the magnetic field distribution are determined in a calculation step ($S_{calc}$) and compensated by a linear as well as a non-linear dynamic change in the currents in said shim coils, wherein the magnetic field distribution is calculated without additional measuring steps directly from the phase change of the image caused by periodic change of the echo time of the echo planar imaging sequences.

4. Method according to claim 3, characterized in that the change in the magnetic field distribution is sequentially calculated from the temporal change in the phase of the image data ("dynamic reference").

5. Magnetic resonance (NMR) method for fast, dynamic, spatially resolved measurement of the temporal changes in NMR signals by means of repeated data acquisition in individual measurements (Acq) with measuring sequences which are sensitive to a parameter to be observed, in an NMR apparatus with shim coils which correct the magnetic field, characterized in that during data acquisition of each individual measurement (Acq) in repeated acquisition steps ($S_1 \ldots S_n$) with a time lag, the two- or three-dimensional spatial magnetic field distribution in the NMR apparatus is measured, and that associated technically or physiologically based changes in the magnetic field distribution are determined in a calculation step ($S_{calc}$), and compensated by a linear as well as a non-linear dynamic change in the currents in said shim coils, wherein the acquisition steps ($S_1 \ldots S_n$) are performed at the start of the measurement for a reference measurement of the magnetic field distribution and, during the measurement only the change in the magnetic field distribution is measured in a periodically repetitive manner by means of further acquisition steps ($S_1 \ldots S_m$) ("static reference").

* * * * *